(12) United States Patent  
Maekawa

(10) Patent No.: US 10,804,164 B2  
(45) Date of Patent: Oct. 13, 2020

(54) METHOD OF MANUFACTURING SEMICONDUCTOR DEVICE

(71) Applicant: RENESAS ELECTRONICS CORPORATION, Tokyo (JP)

(72) Inventor: Keiichi Maekawa, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 90 days.

(21) Appl. No.: 16/129,592

(22) Filed: Sep. 12, 2018

(65) Prior Publication Data

US 2019/0164847 A1 May 30, 2019

(30) Foreign Application Priority Data

Nov. 27, 2017 (JP) .................. 2017-226708

(51) Int. Cl.
| H01L 21/8238 | (2006.01) |
| H01L 29/06 | (2006.01) |
| H01L 25/07 | (2006.01) |
| H01L 21/3115 | (2006.01) |
| H01L 21/84 | (2006.01) |
| H01L 29/786 | (2006.01) |

(52) U.S. Cl.
CPC ........ *H01L 21/823857* (2013.01); *H01L 21/31155* (2013.01); *H01L 21/823864* (2013.01); *H01L 21/84* (2013.01); *H01L 25/072* (2013.01); *H01L 29/0603* (2013.01); *H01L 29/78606* (2013.01); *H01L 21/823892* (2013.01)

(58) Field of Classification Search
None
See application file for complete search history.

(56) References Cited

U.S. PATENT DOCUMENTS

| 9,214,515 B2* | 12/2015 | Le Tiec | .............. H01L 29/1608 |
| 9,966,452 B2 | 5/2018 | Oda | |
| 2013/0341649 A1* | 12/2013 | Le Tiec | ............. H01L 21/76254 257/77 |

FOREIGN PATENT DOCUMENTS

| JP | 2006-059843 A | 3/2006 |
| JP | 2011-009571 A | 1/2011 |
| JP | 2016-066678 A | 4/2016 |

* cited by examiner

*Primary Examiner* — David E Graybill

(74) *Attorney, Agent, or Firm* — McDermott Will & Emery LLP

(57) ABSTRACT

To improve reliability of a semiconductor device, in a method of manufacturing the semiconductor device, a ground plane region of an n-type MISFET is formed by ion-implanting a p-type impurity and nitrogen (N) and a ground plane region of a p-type MISFET is formed by ion-implanting an n-type impurity and one of carbon (C) and fluorine (F).

7 Claims, 16 Drawing Sheets

METHOD OF MANUFACTURING SEMICONDUCTOR DEVICE

CROSS-REFERENCE TO RELATED APPLICATIONS

The disclosure of Japanese Patent Application No. 2017-226708 filed on Nov. 27, 2017 including the specification, drawings and abstract is incorporated herein by reference in its entirety.

BACKGROUND

The present invention relates to a method of manufacturing a semiconductor device, and relates to an effective technique when being applied to a method of manufacturing a semiconductor device using an SOI substrate, for example.

There is a technique of forming a MISFET (Metal Insulator Semiconductor Field Effect Transistor) on an SOI (Silicon On Insulator) substrate as a semiconductor device for low power consumption application. This MISFET is formed in a semiconductor layer provided over a semiconductor substrate via a BOX layer (insulating film). Further, a ground plane region (semiconductor region) corresponding to a back gate is provided in the semiconductor substrate. A threshold voltage of the MISFET is adjusted by applying a desired voltage to this ground plane region.

For example, Japanese Unexamined Patent Application Publication No. 2016-66678 discloses a technique of suppressing diffusion of impurities forming a ground plane region by forming the ground plane region in a silicon carbide film. Japanese Unexamined Patent Application Publication No. 2016-66678 also discloses an example of forming the ground plane region by ion-implanting carbon and boron into a semiconductor substrate made of silicon.

Japanese Unexamined Patent Application Publication No. 2006-59843 discloses a technique of ion-implanting diffusion suppressing element (fluorine, nitrogen, or carbon) in a p-channel MISFET to surround an extension region in order to suppress a short channel effect.

Japanese Unexamined Patent Application Publication No. 2011-9571 discloses a technique of ion-implanting nitrogen in a lower portion of an extension region in an n-channel MISFET in order to reduce a local variation of a threshold value.

SUMMARY

In a MISFET formed on an SOI substrate, as an impurity concentration of a ground plane region is reduced, the performance of a semiconductor substrate degrades. The inventors of the present application have confirmed that reliability of the MISFET is lowered, particularly when the impurity concentration at an interface between the ground plane region and a BOX layer is reduced.

Other objects and novel features will be apparent from the description of this specification and the accompanying drawings.

A method of manufacturing a semiconductor device according to an embodiment forms a ground plane region of an n-channel MISFET by ion-implantation of a p-type impurity and nitrogen (N), and forms a ground plane region of a p-channel MISFET by ion-implantation of an n-type impurity and carbon (C) or fluorine (F).

According to the embodiment, it is possible to improve reliability of a semiconductor device.

DETAILED DESCRIPTION

Figure 1:
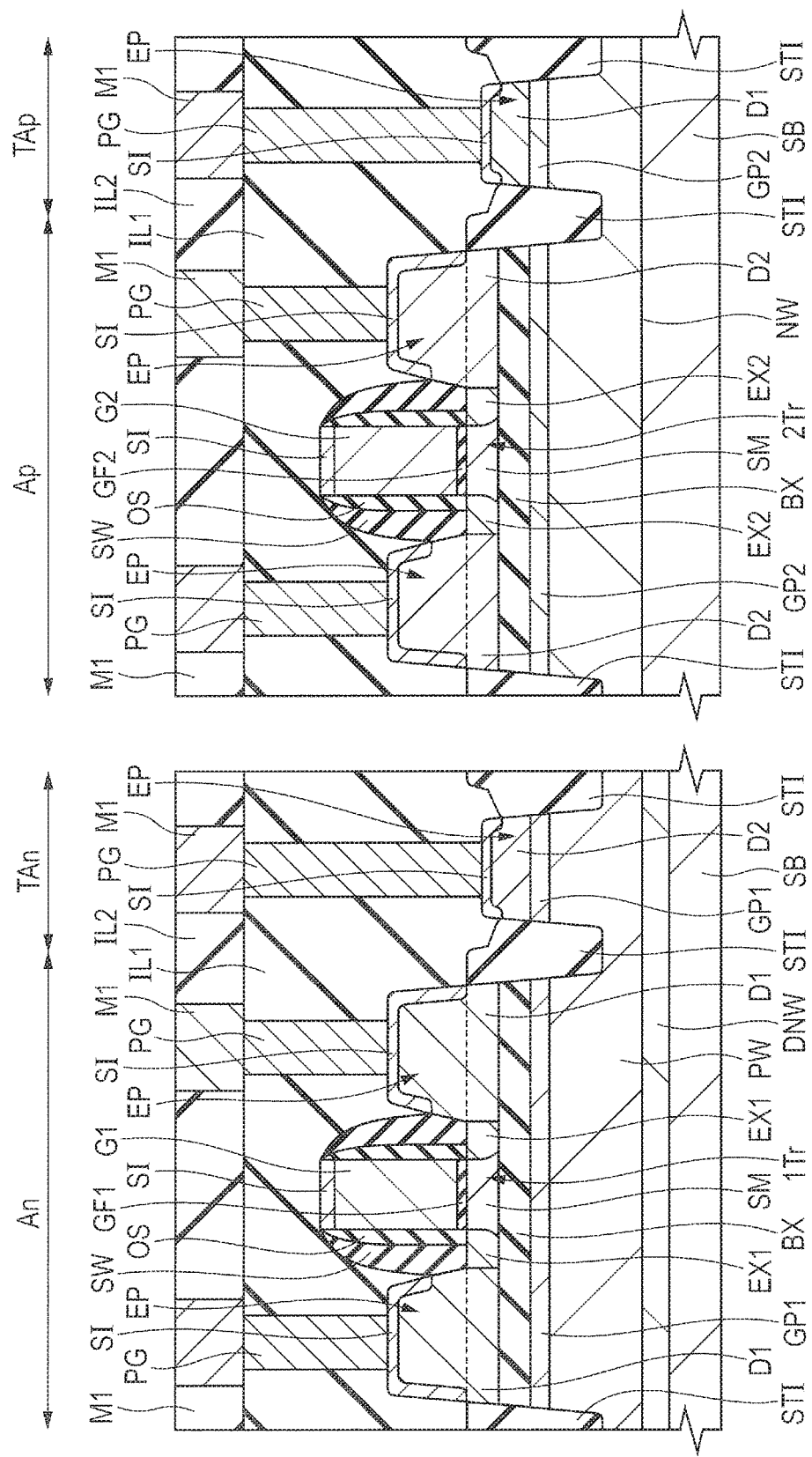
FIG. 1 is a cross-sectional view of a semiconductor device according to an embodiment.

The following embodiments will be described while being divided into a plurality of sections or embodiments, if necessary for the sake of convenience. However, unless otherwise specified, these are not independent of each other, but are in a relation such that one is a modification, details, complementary explanation, or the like of a part or the whole of the other. In the following embodiments, when a reference is made to the number of elements and the like (including numerical value, quantity, range, and the like), the number of elements is not limited to the specific number, but can be the specific number or more or less, unless otherwise specified, or except the case where the number is apparently limited to the specific number in principle, or except for other cases. Further, in the following embodiments, the constitutional elements (including element steps and the like) are not always essential, unless otherwise specified, or except the case where they are apparently considered essential in principle, or except for other cases. Similarly, in the following embodiments, when a reference is made to the shapes, positional relationships, or the like of the constitutional elements or the like, it is understood that they include ones substantially analogous or similar to the shapes or the like, unless otherwise specified, or unless otherwise considered apparently in principle, or except for other cases. This also applies to the foregoing numerical value and range.

Embodiments are described in detail below, referring to the drawings. Throughout the drawings for explaining the embodiments, components having the same function are labeled with the same reference sign and repetition of the description is omitted. In the following embodiments, the description of the same or similar portion is not repeated in principle unless particularly necessary.

Embodiment

A MISFET according to the present embodiment has a fully depleted silicon on insulator (FD-SOI) configuration. A semiconductor layer located below a gate electrode is a channel having a sufficiently low impurity concentration or a channel into which no impurity is introduced, that is, a so-called dopant-less channel. A threshold value (threshold voltage) of the MISFET is adjusted by providing a ground plane region corresponding to a back gate in a semiconductor substrate below a BOX layer (hereinafter, referred to as an insulating layer BX) and applying a desired voltage to that ground plane region.

Figure 16:
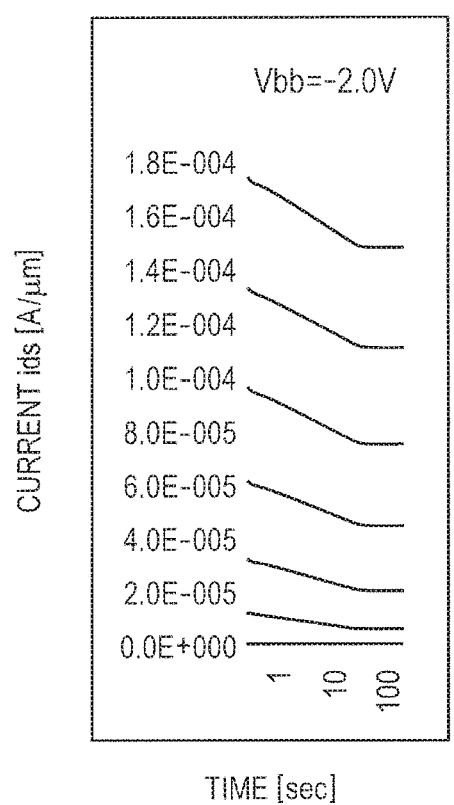
FIG. 16 illustrates characteristics of source-drain current of a MISFET.

The studies by the inventors of the present application have revealed that reduction of the impurity concentration at an interface between the ground plane region and the insulating layer BX causes reliability of the MISFET to be lowered. In an n-channel MISFET having a fully depleted SOI configuration, a threshold value can be lowered by applying negative voltage to a ground plane region. However, when the impurity concentration of the ground plane region is reduced, the characteristics of the MISFET have a time constant, as illustrated in FIG. 16. That is, it has been confirmed that it takes longtime until source-drain current Ids of the MISFET becomes stable. In a case of causing the MISFET to operate by applying negative voltage to the ground plane region, when the impurity concentration of the ground plane region has been reduced, a depletion layer is formed at the interface with the insulating layer BX in the first stage, and an inversion layer is formed at the interface with the insulating layer BX in the second stage. Because parasitic capacitance between a gate electrode and the ground plane region in the first stage and that in the second stage are different from each other, the source-drain current Ids is varied.

The present embodiment provides a technique for keeping the impurity concentration of the ground plane region directly below the insulating layer BX high.

Semiconductor Device of Present Embodiment

FIG. 1 illustrates a cross-sectional structure of an n-channel MISFET 1Tr and a p-channel MISFET 2Tr that form a semiconductor device of the present embodiment.

The semiconductor device of the present embodiment includes a region An in which the n-channel MISFET 1Tr to be formed, a region TAn that is a region for supplying power to a well region PW of the region An, a region Ap in which the p-channel MISFET 2Tr to be formed, and a region TAp that is a region for supplying power to a well region NW of the region Ap.

The region An and the region TAn are separated from each other by an isolation portion STI formed in a semiconductor substrate SB. The well region PW is formed to be deeper than the isolation portion STI to spread over the region An and the region TAn. The region Ap and the region TAp are separated from each other by the isolation portion STI. The well region NW is formed to be deeper than the isolation portion STI to spread over the region Ap and the region TAp.

The insulating layer BX is formed on the semiconductor substrate SB, and a semiconductor layer SM is formed on the insulating layer BX. That is, the semiconductor layer SM and the semiconductor substrate SB are electrically isolated from each other by the insulating layer BX. The thickness of the insulating layer BX is about 10 to 20 nm, and the thickness of the semiconductor layer SM is about 10 to 20 nm. Further, in the region TAn and the region TAp that are power-supplying regions, the insulating layer BX and the semiconductor layer SM are removed. Therefore, voltage can be applied to the well region PW and the well region NW individually via an epitaxial layer EP.

First, the structure of the MISFET 1Tr in the region An is described.

In the region An, an n-well region DNW is formed in the semiconductor substrate SB. In the well region DNW, the p-well region PW is formed. The well region PW is electrically isolated from the semiconductor substrate SB by the well region DNW. In a surface of the well region PW, which is in contact with the insulating layer BX, a p-type ground plane region (impurity region) GP1 having a higher impurity concentration than that of the well region PW is formed. The ground plane region GP1 serves as a back gate of the MISFET 1Tr. A threshold value of the MISFET 1Tr is adjusted by supplying a desired voltage to the ground plane region GP1.

The well region PW and the ground plane region GP1 are regions into which a p-type impurity, e.g., boron (B), is introduced. The impurity concentration of the well region PW is about $5\times10^{17}$ to $5\times10^{18}/cm^3$, and the impurity concentration of the ground plane region GP1 is about $1\times10^{18}$ to $1\times10^{19}/cm^3$. In addition, nitrogen is implanted into the ground plane region GP1 in the present embodiment, and its concentration is $1\times10^{19}$ to $1\times10^{20}/cm^3$.

In the region An, a gate electrode G1 is formed on the semiconductor layer SM via a gate insulating film GF1. The gate insulating film GF1 is formed by a silicon oxide film or a silicon oxynitride film, for example. The gate electrode G1 is formed by a polysilicon film, for example.

A side wall spacer SW is formed over a side surface of the gate electrode G1 via an offset spacer OS. An extension region EX1 that is a low-concentration n-type impurity region is formed in the semiconductor layer SM below the offset spacer OF and below the side wall spacer SW. The epitaxial layer EP is formed on a portion of the semiconductor layer SM. A diffusion region D1 is formed in this epitaxial layer EP. The diffusion region D1 is an n-type impurity region having a higher concentration than the extension region EX1. The extension region EX1 and the diffusion region D1 form a source region or a drain region of the MISFET 1Tr.

In the region TAn, the well region DNW and the well region PW are formed, as in the region An. Although the ground plane region GP1 is formed in the surface of the well region PW, the ground plane region GP1 in the region TAn can be omitted. Because the insulating layer BX and the semiconductor layer SM are removed in the region TAn as described above, the epitaxial layer EP is formed to be in direct contact with the well region PW including the ground plane region GP1. A diffusion region D2 that is a p-type impurity region is formed in this epitaxial layer EP. Therefore, voltage supplied to a plug PG in the region TAn is supplied to the ground plane region GP1 in the region An via the epitaxial layer EP and the well region PW.

Next, the structure of the MISFET 2Tr in the region Ap is described.

In the region Ap, an n-well region NM is formed in the semiconductor substrate SB. In a surface of the well region NW, which is in contact with the insulating layer BX, an n-type ground plane region GP2 having a higher impurity concentration than the well region NW is formed. The ground plane region GP2 serves as a back gate of the MISFET 2Tr. A threshold value of the MISFET 2Tr is adjusted by supplying a desired voltage to the ground plane region GP2.

The well region NW and the ground plane region GP2 are regions into which an n-type impurity, e.g., phosphorous (P) or arsenic (As), is introduced. The impurity concentration of the well region NW is about $5 \times 10^{16}$ to $5 \times 10^{12}/\text{cm}^3$, and the impurity concentration of the ground plane region GP2 is about $4 \times 10^{17}$ to $4 \times 10^{18}/\text{cm}^3$. In addition, carbon (C) or fluorine (F) is implanted into the ground plane region GP2 in the present embodiment, and its concentration is $1 \times 10^{19}$ to $1 \times 10^{20}/\text{cm}^3$.

In the region Ap, a gate electrode G2 is formed on the semiconductor layer SM via a gate insulating film GF2. The gate insulating film GF2 is formed by a silicon oxide film or a silicon oxynitride film, for example. That is, the gate insulating film GF1 and the gate insulating film GF2 are formed by the same film in the present embodiment.

The side wall spacer SW is formed over a side surface of the gate electrode G2 via the offset spacer OS. An extension region EX2 that is a low-concentration p-type impurity region is formed in the semiconductor layer SM below the offset spacer OF and below the side wall spacer SW. The epitaxial layer EP is formed on a portion of the semiconductor layer SM. The diffusion region D2 is formed in this epitaxial layer EP. The diffusion region D2 is a p-type impurity region having a higher concentration than the extension region EX2. The extension region EX2 and the diffusion region D2 form a source region or a drain region of the MISFET 2Tr.

In the region TAp, the well region NW is formed, as in the region Ap. Although the ground plane region GP2 is formed in a surface of the well region NW, the ground plane region GP2 in the region TAp can be omitted. Because the insulating layer BX and the semiconductor layer SM are removed in the region TAp as described above, the epitaxial layer EP is formed to be in direct contact with the well region NW including the ground plane region GP2. The diffusion region D1 that is an n-type impurity region is formed in this epitaxial layer EP. Therefore, voltage supplied to the plug PG in the region TAp is supplied to the ground plane region GP2 in the region Ap via the epitaxial layer EP and the well region NW.

Further, the diffusion region D1 formed in the region An and the diffusion region D1 formed in the region TAp are n-type impurity regions formed by the same process, as will be described later. Similarly, the diffusion region D2 formed in the region Ap and the diffusion region D2 formed in the region TAn are p-type impurity regions formed by the same process.

A silicide layer, made of nickel silicide (NiSi) or cobalt silicide ($CoSi_2$), for example, is formed on the gate electrode G1, the gate electrode G2, and the epitaxial layer EP in order to reduce contact resistance with the plug PG.

An interlayer insulating film IL1 is formed in the region An, the region Ap, the region TAn, the region TAp to cover the MISFET 1Tr and the MISFET 2Tr. As the interlayer insulating film IL1, a single layer film of a silicon oxide film, or a multilayered film of a silicon nitride film and a thick silicon oxide film formed thereon can be used, for example. Contact holes are formed in the interlayer insulating film ILL. By embedding a conductive film mainly made of tungsten (W) or the like into the contact holes, a plurality of plugs PG are formed in the interlayer insulating film ILL. Each plug PG is coupled to the gate electrode G1, the gate electrode G2, and the epitaxial layer EP via the silicide layer SI.

An interlayer insulating film IL2 is formed on the interlayer insulating film IL1 into which the plugs PG are embedded. In the interlayer insulating film IL2, a groove for wire is formed. By embedding a conductive film made of copper as a main component, for example, into the groove for wire, a wire M1 to be coupled to the plug PG is formed in the interlayer insulating film IL2.

Method of Manufacturing Semiconductor Device of Present Embodiment

A method of manufacturing a semiconductor device of the present embodiment is described below, referring to FIGS. 2 to 11.

Figure 2:
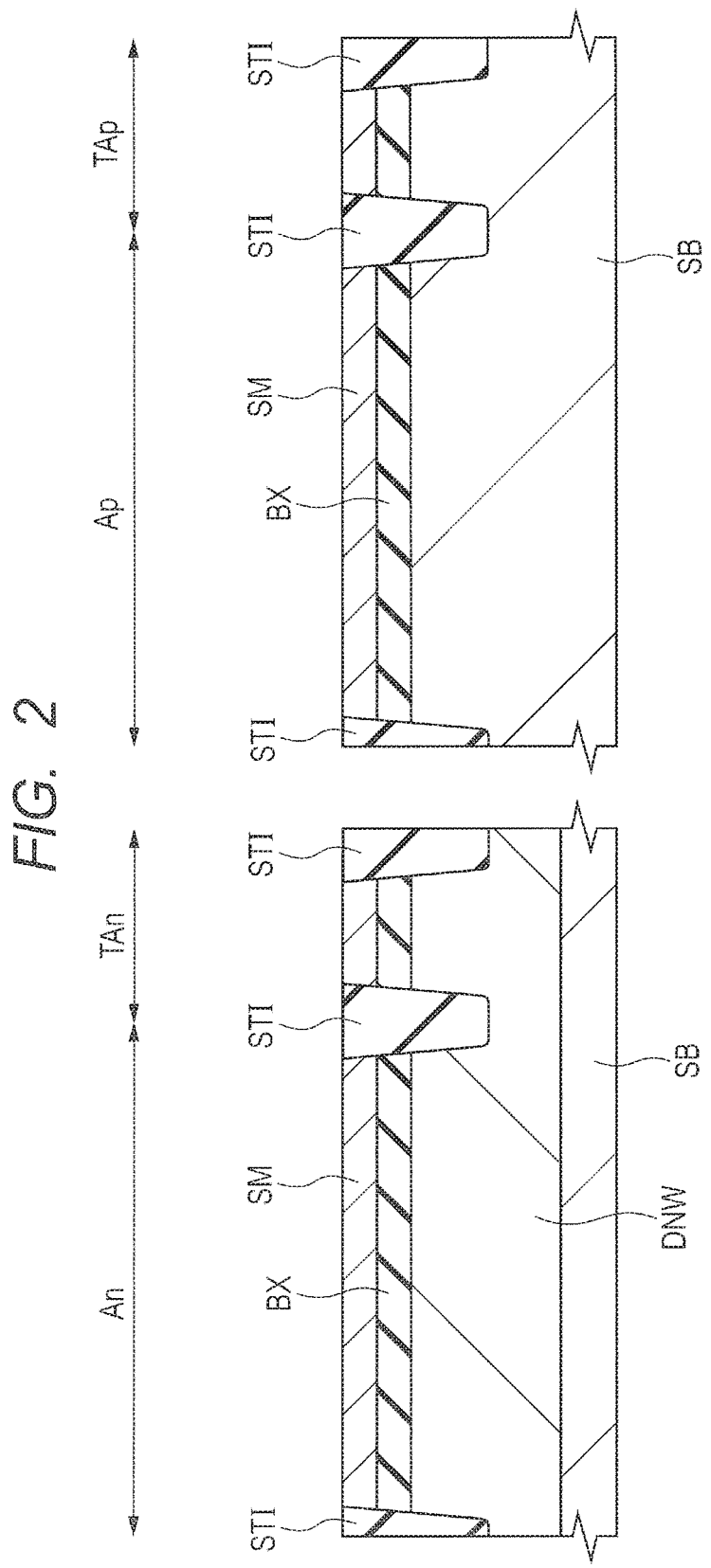
FIG. 2 is a cross-sectional view illustrating a manufacturing step of the semiconductor device according to the embodiment.

FIG. 2 illustrates a so-called SOI substrate that includes the semiconductor substrate SM as a supporting substrate, the insulating layer BX formed on the semiconductor substrate SB, and the semiconductor layer SM formed on the insulating layer BX.

The semiconductor substrate SB is made of single crystal silicon preferably having a resistivity of about 1 to 10 Ωcm, for example, p-type single crystal silicon. The insulating layer BX is made of silicon oxide, for example. The thickness of the insulating layer BX is about 10 to 20 nm, for example. The semiconductor layer SM is made of single crystal silicon preferably having a resistivity of about 1 to 10 Ωcm. The thickness of the semiconductor layer SM is about 10 to 20 nm, for example. The semiconductor layer SM is an intrinsic semiconductor layer into which an n-type or p-type impurity is not introduced by ion implantation or the like. Alternatively, even if the semiconductor layer SM contains a p-type impurity introduced thereinto, its impurity concentration is $1 \times 10^{13}/\text{cm}^3$ or less.

Further, FIG. 2 also illustrates the isolation portion STI. The isolation portion STI is formed by forming a groove that extends through the semiconductor layer SM and the insulating layer BX and reaches the semiconductor substrate SB, and embedding an insulating film into the groove. The region An, the region Ap, the region TAn, and the region TAp are isolated from each other by the isolation portion STI.

Subsequently, the n-well region DNW is formed in the semiconductor substrate SB in the region An and the region TAn by photolithography and ion implantation.

Figure 3:
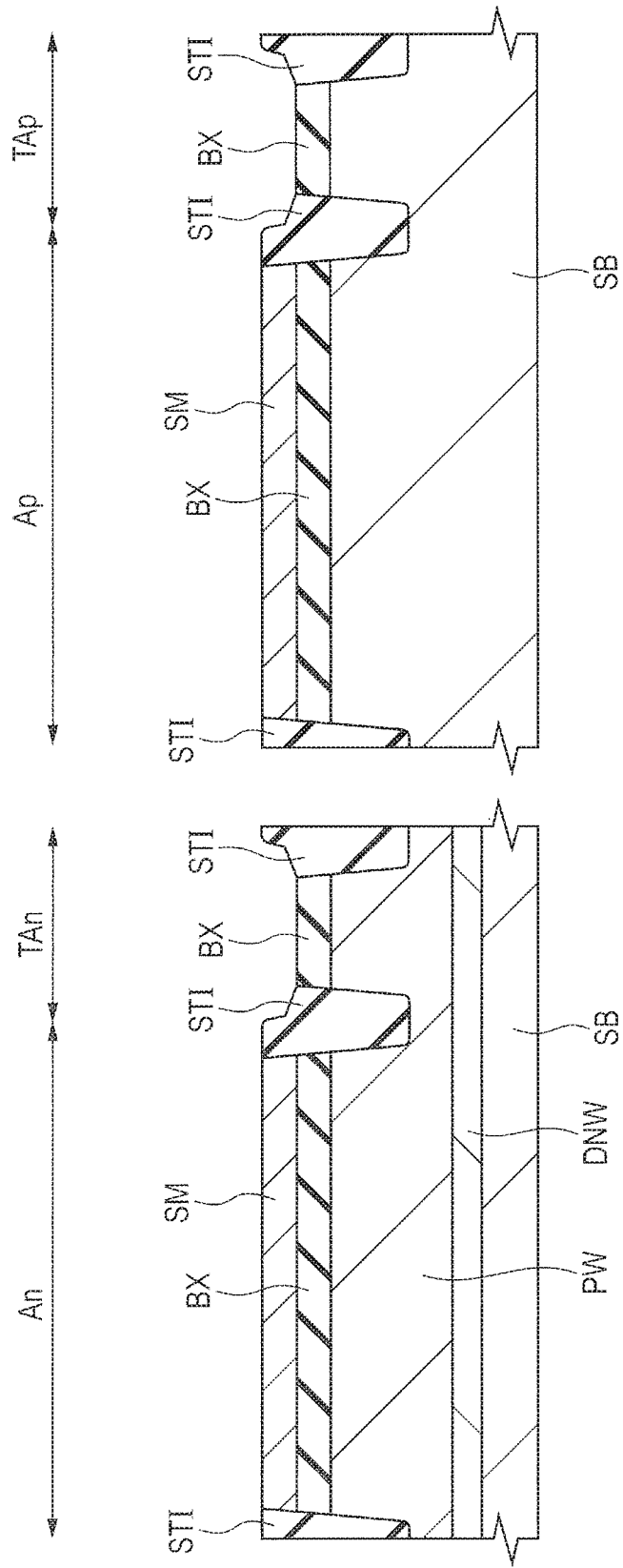
FIG. 3 is a cross-sectional view illustrating a manufacturing step of the semiconductor device subsequent to FIG. 2.

Next, as illustrated in FIG. 3, the semiconductor layer SM in the region TAn and the region TAp is selectively removed by photolithography and dry etching to expose the insulating layer BX in the region TAn and the region TAp. Subsequently, in the region An and the region TAn, the p-well region PW is formed in the well region DNW. The impurity concentration of the well region PW is about $5 \times 10^{17}$ to $5 \times 10^{18}$/cm$^3$. For example, the well region PW is formed by ion-implanting boron (B) or boron difluoride (BF$_2$).

Figure 4:
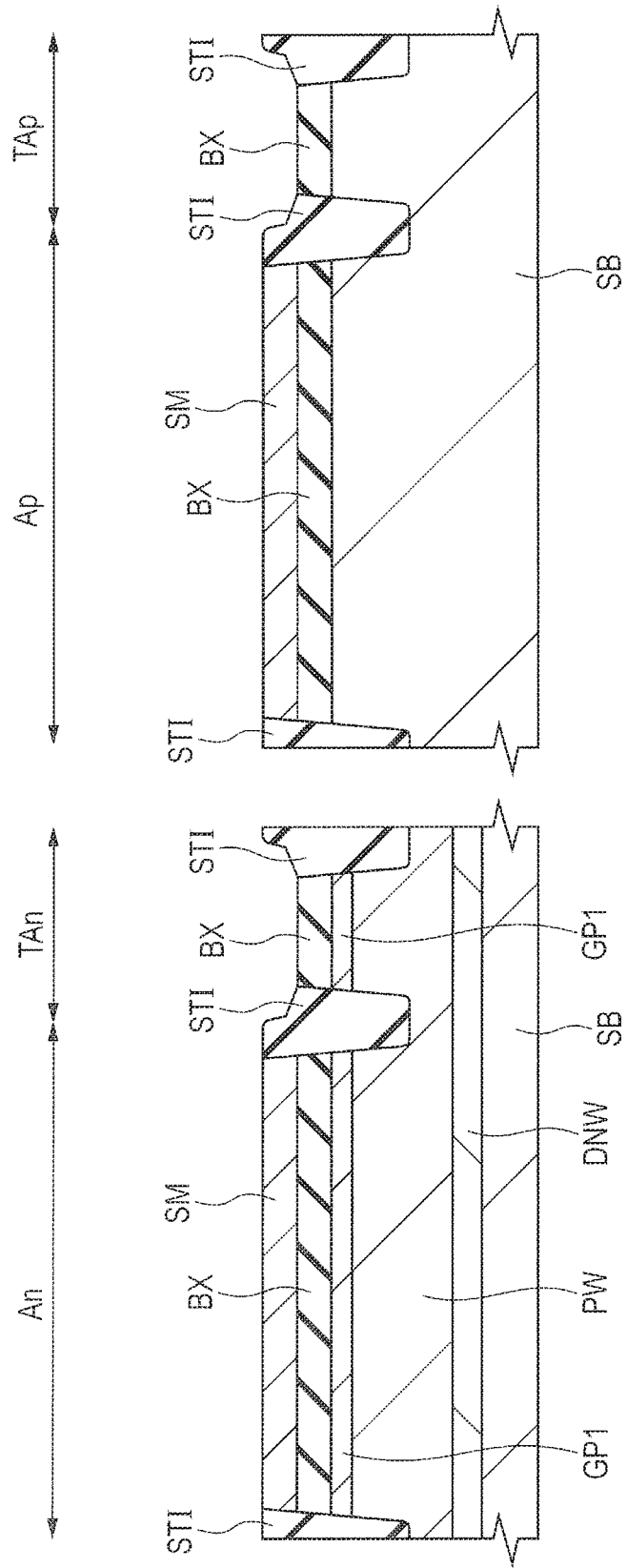
FIG. 4 is a cross-sectional view illustrating a manufacturing step of the semiconductor device subsequent to FIG. 3.

The ground plane region GP1 is then formed in the well region PW in the region An and the region TAn by photolithography and dry etching, as illustrated in FIG. 4. In formation of the ground plane region GP1, ion implantation of boron (B) or boron difluoride (BF$_2$) as a p-type impurity is performed, and thereafter ion implantation of nitrogen (B) that is an inert dopant is performed, for example. However, ion implantation of boron (B) or boron difluoride (BF$_2$) can be performed after ion implantation of nitrogen (N). For example, the dose amount of boron (B) is $5 \times 10^{13}$/cm$^2$ and implantation energy is 40 KeV, and the dose amount of nitrogen (N) is $5 \times 10^{14}$/cm$^2$ and implantation energy is 40 KeV.

Figure 5:
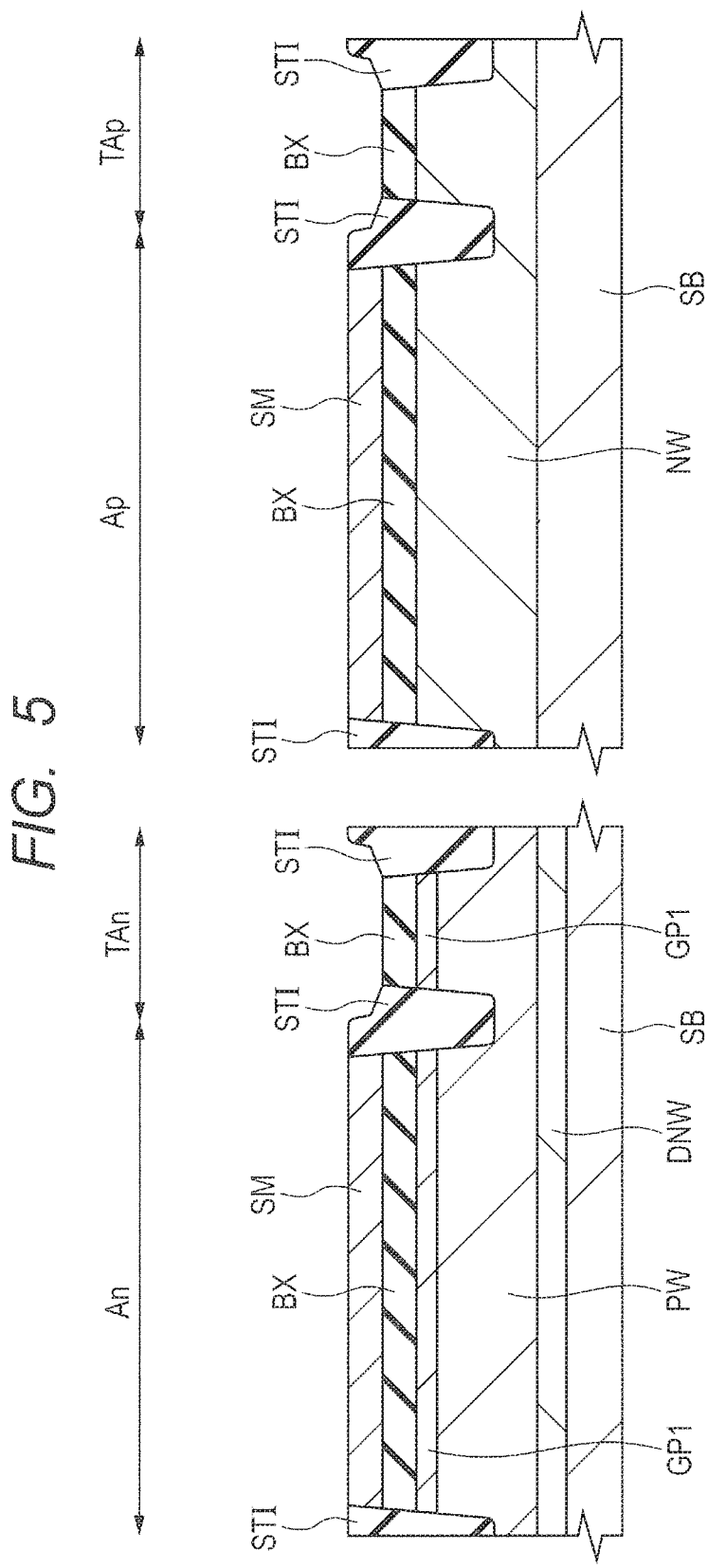
FIG. 5 is a cross-sectional view illustrating a manufacturing step of the semiconductor device subsequent to FIG. 4.

Subsequently, in the region Ap and the region TAp, the n-well region NW is formed in the semiconductor substrate SB, as illustrated in FIG. 5. The impurity concentration of the well region NW is about $5 \times 10^{16}$ to $5 \times 10^{17}$/cm$^3$. The well region NW is formed by ion-implanting phosphorous (P) or arsenic (As), for example.

Figure 6:
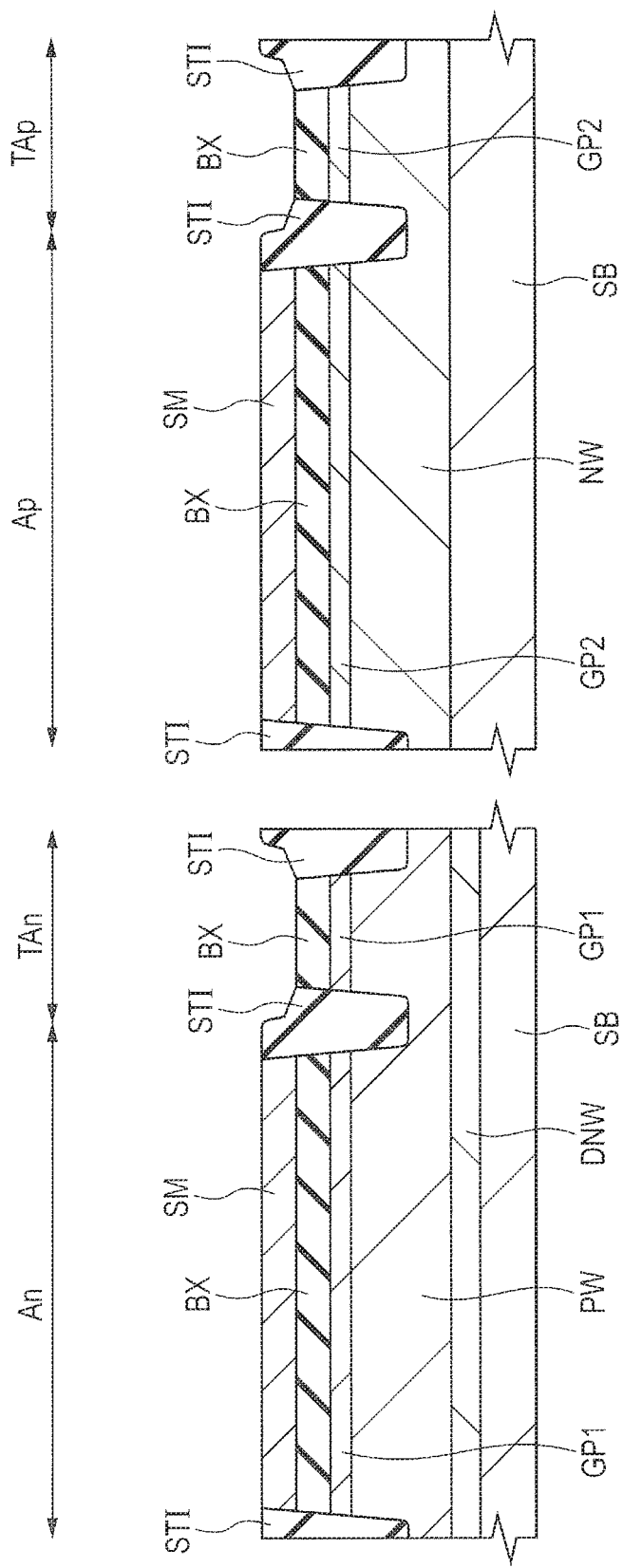
FIG. 6 is a cross-sectional view illustrating a manufacturing step of the semiconductor device subsequent to FIG. 5.

Subsequently, as illustrated in FIG. 6, in the region Ap and the region TAp, the n-type ground plane region GP2 is formed in the well region NW by photolithography and dry etching. In formation of the ground plane region GP2, ion implantation of phosphorous (P), arsenic (As), or antimony (Sb) as an n-type impurity is performed, and thereafter ion implantation of carbon (C) or fluorine (F) that is an inert dopant is performed, for example. However, ion implantation of phosphorous (P), arsenic (As), or antimony (Sb) can be performed after ion implantation of carbon (C) or fluorine (F). For example, the dose amount of phosphorus (P) is $5 \times 10^{13}$/cm$^2$ and implantation energy is 90 KeV, and the dose amount of carbon (C) is $5 \times 10^{14}$/cm$^2$ and implantation energy is 50 KeV.

Figure 7:
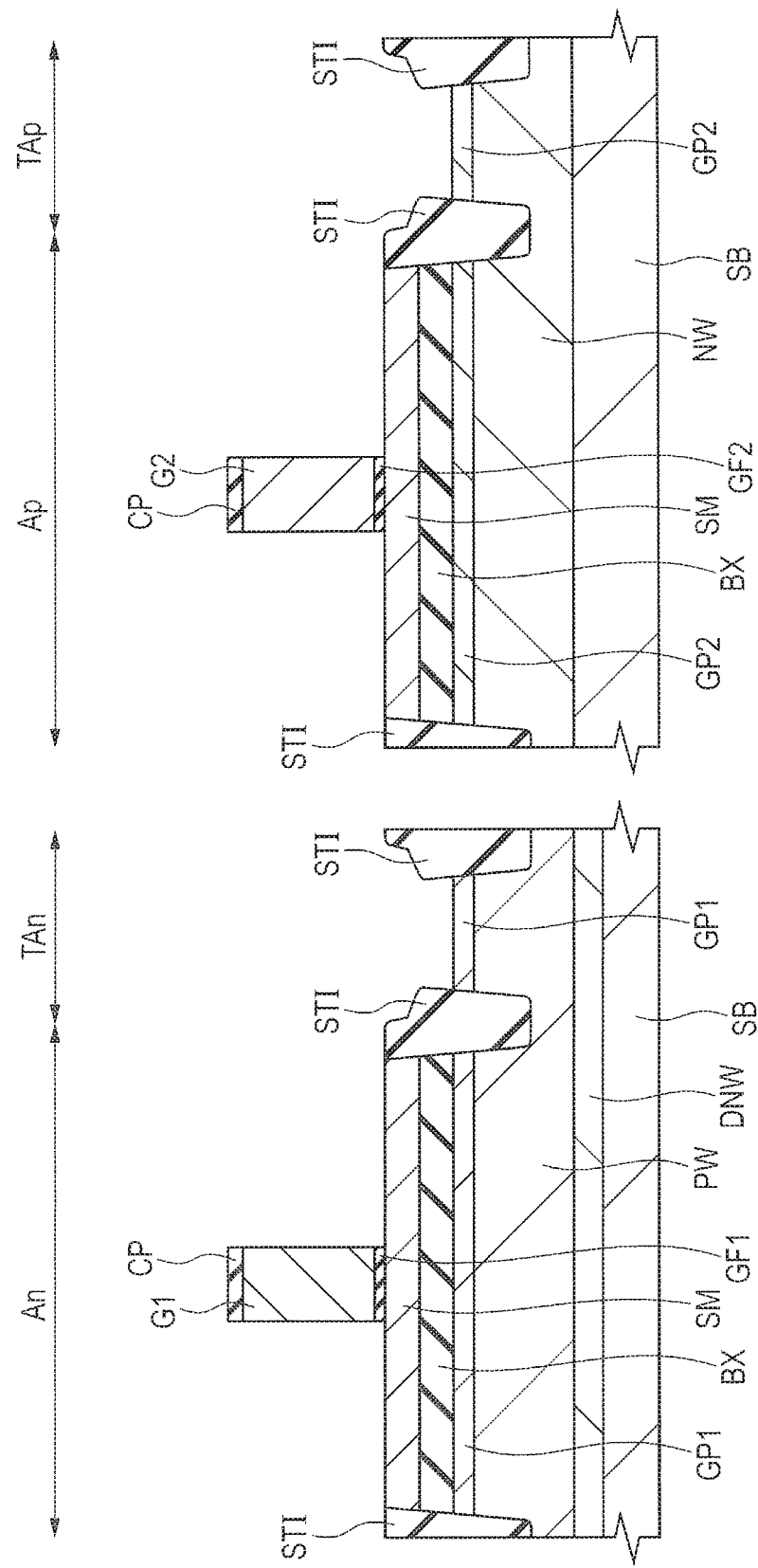
FIG. 7 is a cross-sectional view illustrating a manufacturing step of the semiconductor device subsequent to FIG. 6.

Subsequently, as illustrated in FIG. 7, the gate insulating films GF1 and GF2 formed by a silicon oxide film, for example, are formed on the semiconductor layer SM in the region An and the region Ap by thermal oxidation, for example. The thickness of the gate insulating films GF1 and GF2 is about 2 to 3 nm. The thermal oxidation is performed at a temperature of 800° C. to 1100° C.

Subsequently, the gate electrodes G1 and G2 are formed on the gate insulating films GF1 and GF2 in the region An and the region Ap, respectively. Further, a cap film CP is formed on each gate electrode. The gate electrodes G1 and G2 are formed by a polysilicon film, for example. The cap film CP is formed by a silicon oxide film, for example. Specifically, an insulating film for forming the gate insulating films GF1 and GF2, a conductor film for forming the gate electrodes G1 and G2, and an insulating film for forming the cap film CP are sequentially formed, and thereafter these films are processed by photolithography and dry etching (or wet etching). In this manner, a multilayered structure of the gate insulating film GF1, the gate electrode G1, and the cap film CP is formed in the region An, and a multilayered structure of the gate insulating film GF2, the gate electrode G2, and the cap film CP is formed in the region Ap. When the gate insulating films GF1 and GF2 are processed, the insulating layer BX in the regions TAn and TAp is also removed, so that the ground plane regions GP1 and GP2 are exposed.

Figure 8:
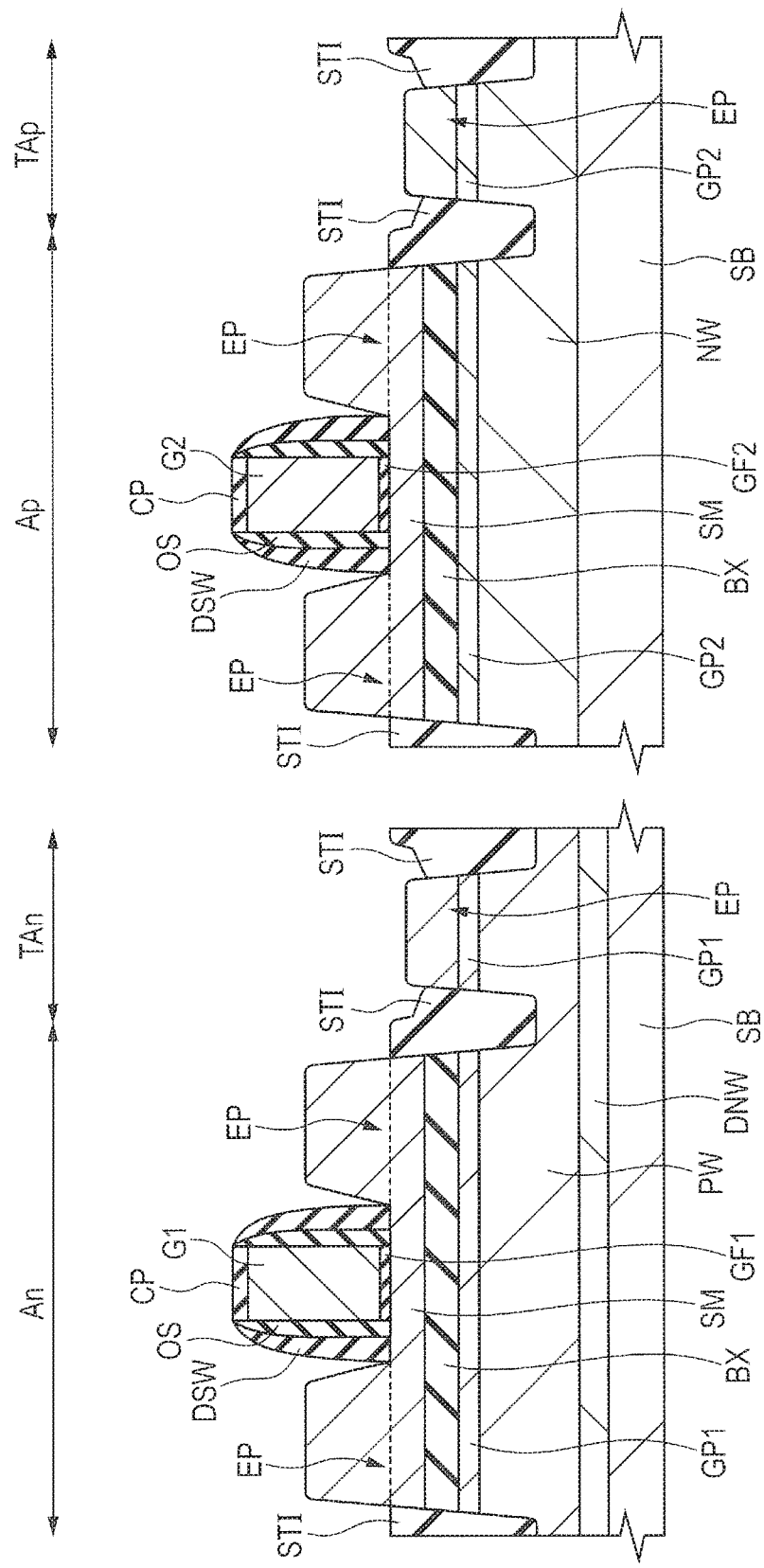
FIG. 8 is a cross-sectional view illustrating a manufacturing step of the semiconductor device subsequent to FIG. 7.

FIG. 8 illustrates a step of forming the offset spacer OS, a dummy side wall spacer DSW, and the epitaxial layer EP.

First, an insulating film, for example, formed by a silicon oxide film, is formed by CVD, for example, to cover the region An, the region Ap, the region TAn, and the region TAp. Subsequently, anisotropic etching is performed for this insulating film, so that the offset spacer OF is formed on a side surface of each of the gate electrode G1 and the gate electrode G2. In this process, in the region TAn and the region Tap, the insulating film for the offset spacer OS is removed by anisotropic etching and the semiconductor substrate SB is exposed.

Subsequently, an insulating film formed by a silicon nitride film, for example, is formed by CVD, for example, to cover the region An, and the region Ap, the region TAn, and the region TAp. Then, anisotropic etching is performed for this insulating film, so that the dummy side wall spacer DSW is formed on the side surface of each of the gate electrode G1 and the gate electrode G2 via the offset spacer OS. In this process, in the region TAn and the region Tap, the insulating film for the dummy side wall spacer DSW is removed by anisotropic etching and the semiconductor substrate SB is exposed.

Subsequently, the epitaxial layer EP (semiconductor layer EP), made of single crystal silicon, for example, is formed on the semiconductor layer SM in the region An and the region Ap and over the semiconductor substrate SB in the region TAn and the region TAp by epitaxial growth. The thickness of the semiconductor layer EP is about 20 to 40 nm. In this process, the epitaxial layer EP is not formed on the gate electrode G1 and on the gate electrode G2, because the gate electrode G1 and the gate electrode G2 are covered by the cap film CP.

Because the epitaxial layer EP is made of the same material as the semiconductor layer SM, those are integrated with each other. However, in the present embodiment, the epitaxial layer EP is illustrated with an arrow and a boundary between the epitaxial layer EP and the semiconductor layer SM is illustrated with broken line in order to provide easy understanding of the invention.

Figure 9:
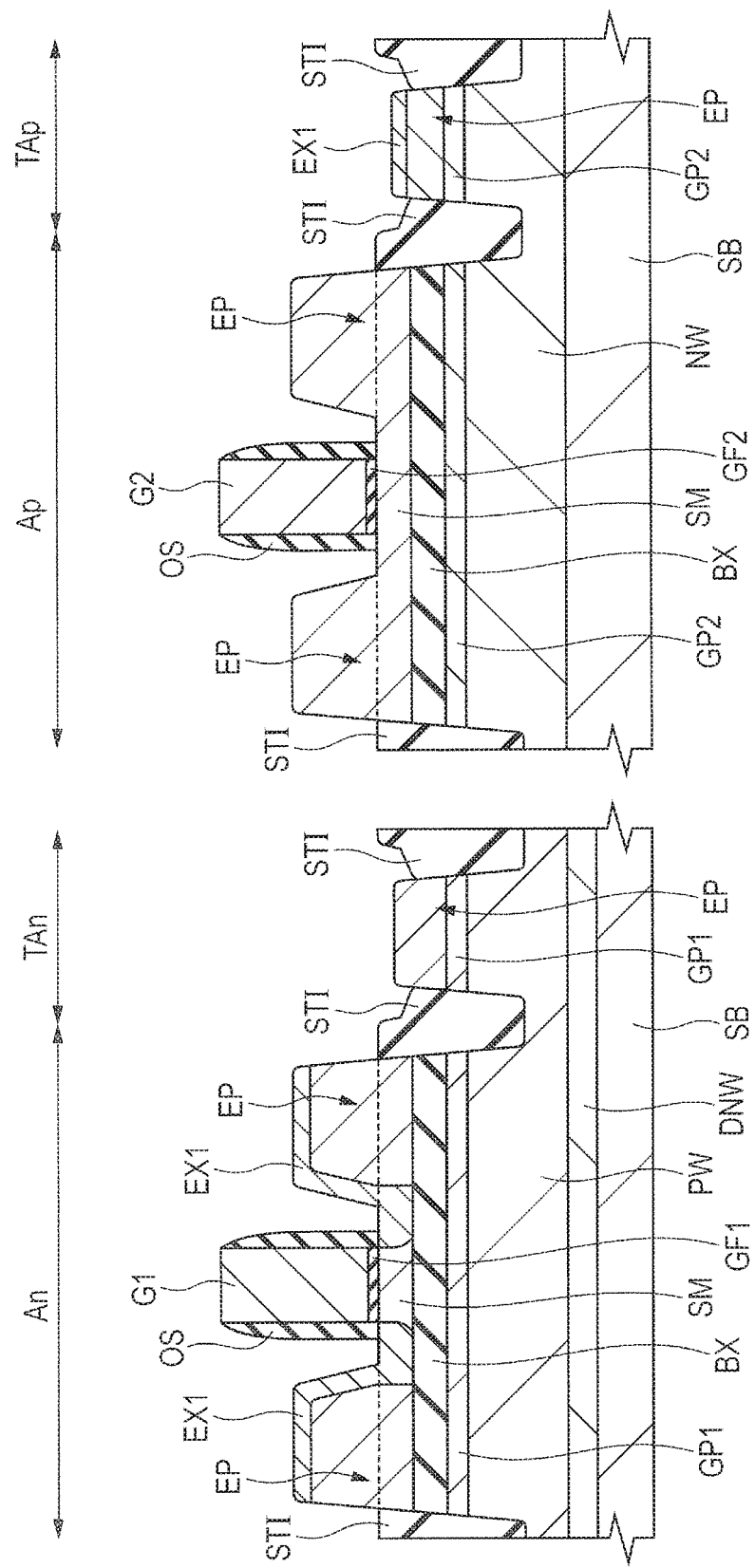
FIG. 9 is a cross-sectional view illustrating a manufacturing step of the semiconductor device subsequent to FIG. 8.

FIG. 9 illustrates a step of removing the dummy side wall spacer DSW and the cap film CP and a step of forming the extension region EX1.

First, etching is performed under a condition where the offset spacer OS is hardly etched, thereby removing the dummy side wall spacer DSW and the cap film CP in the region An and the region Ap. Because the dummy side wall spacer DSW and the cap insulating film CP are formed of the same material, these can be removed at the same time. Therefore, addition of mask is not required, resulting in simplification of a manufacturing process.

Subsequently, the n-type extension region (impurity region) EX1 is formed in the semiconductor layer SM and the epitaxial layer EP on both sides of the gate electrode G1 in the region An by photolithography and ion implantation. The extension region EX1 is formed by ion implantation of phosphorous (P) or arsenic (As), for example, in the region An and the region TAp. The extension region EX1 forms a portion of a source region or a portion of a drain region of the MISFET 1Tr. Although the extension region EX1 is also formed in a surface of the epitaxial layer EP in the region TAp, it is not necessary to form the extension region EX1 in the region TAp.

Figure 10:
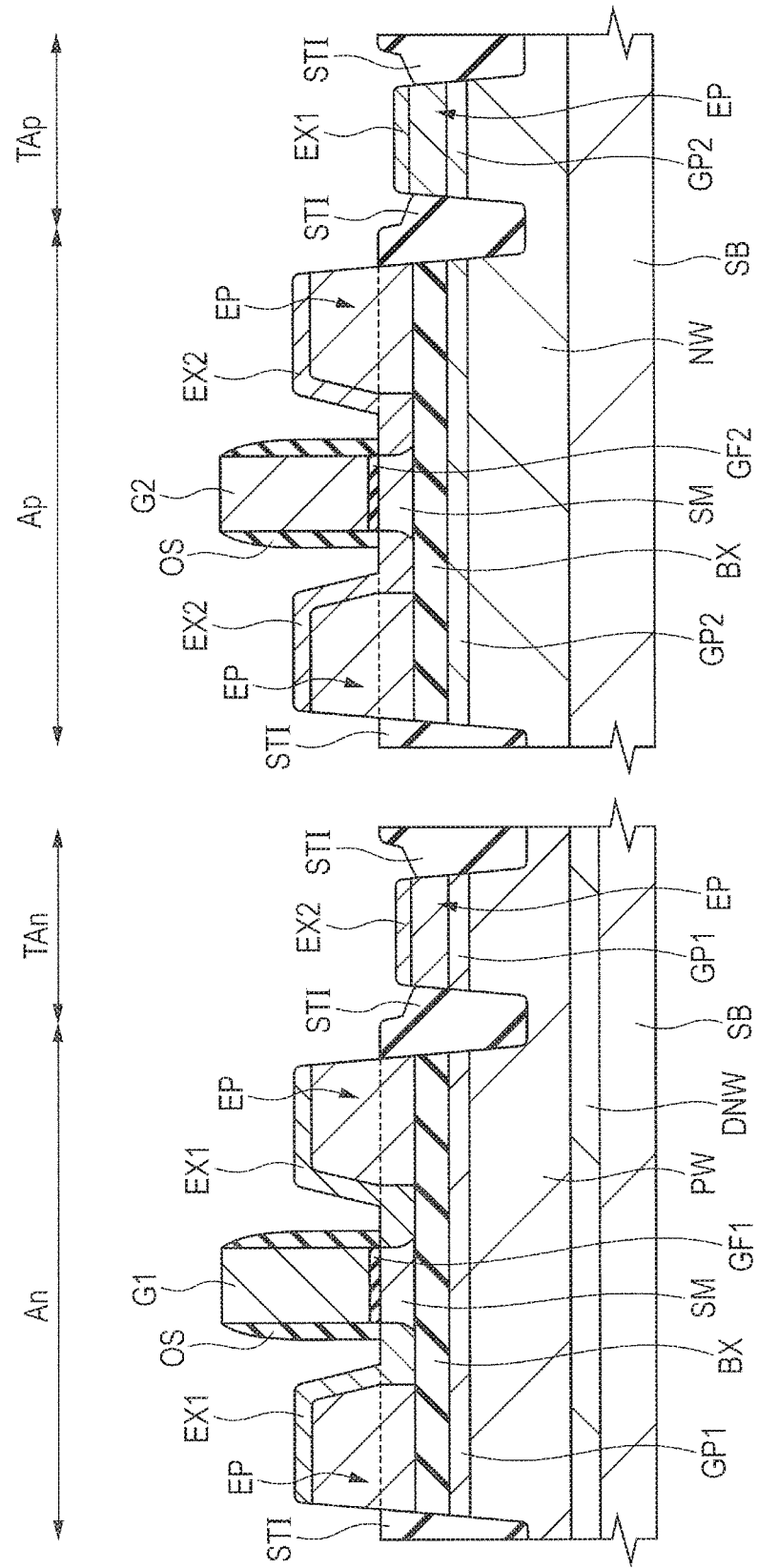
FIG. 10 is a cross-sectional view illustrating a manufacturing step of the semiconductor device subsequent to FIG. 9.

Subsequently, the extension region EX2 is formed, as illustrated in FIG. 10. The p-type extension region (impurity region) EX2 is formed in the semiconductor layer SM and the epitaxial layer EP on both sides of the gate electrode G2 in the region Ap by photolithography and ion implantation. The extension region EX2 is formed by ion implantation of boron (B) or boron difluoride (BF$_2$), for example, in the region Ap and the region TAn. The extension region EX2 forms a portion of a source region or a portion of a drain region of the MISFET 2Tr. Although the extension region EX2 is also formed in a surface of the epitaxial layer EP in the region TAn, it is not necessary to form the extension region EX2 in the region TAn.

Figure 11:
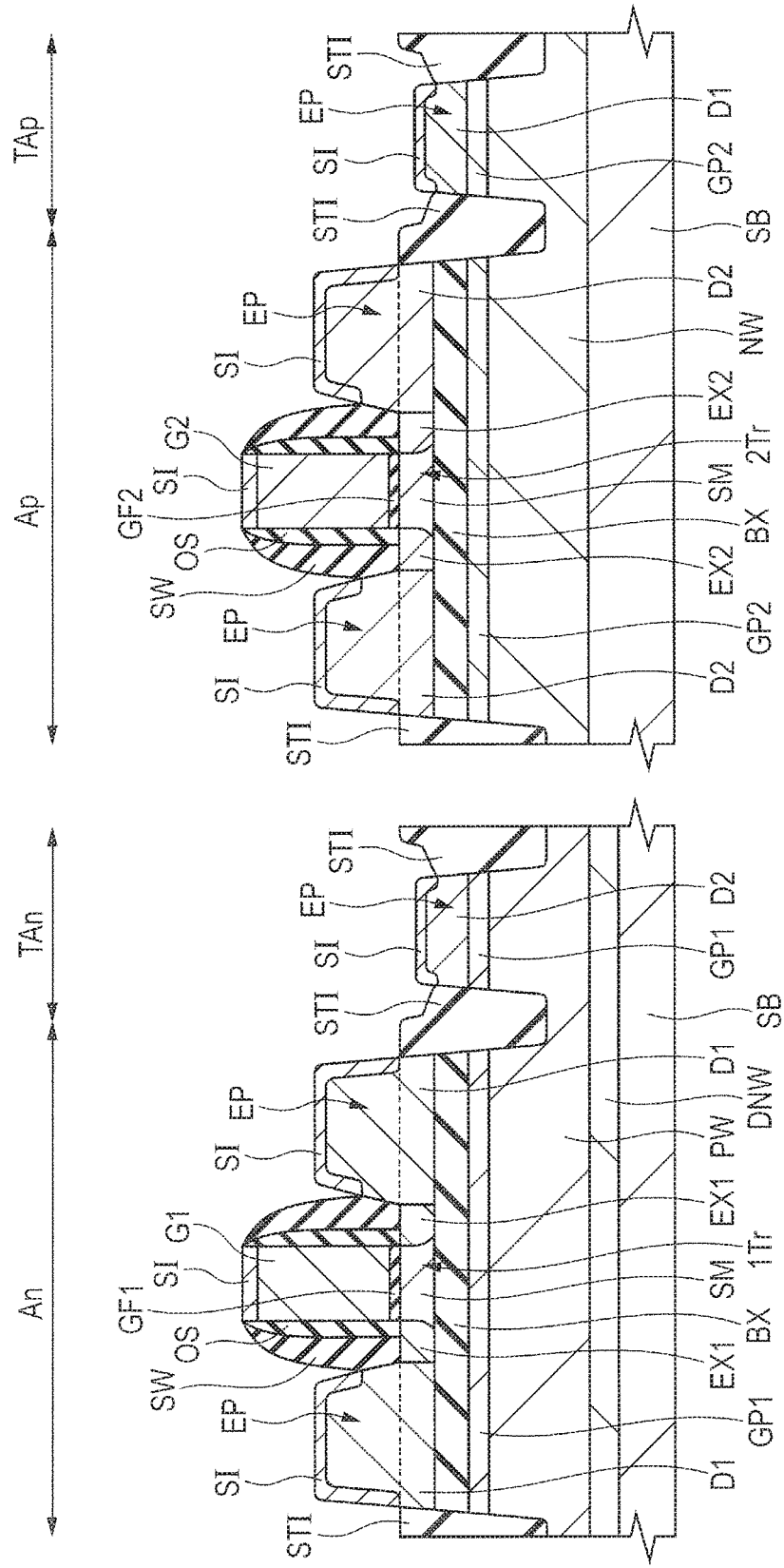
FIG. 11 is a cross-sectional view illustrating a manufacturing step of the semiconductor device subsequent to FIG. 10.

FIG. 11 illustrates a step of forming the side wall spacer SW, the diffusion regions D1 and D2, and the silicide layer SI.

First, an insulating film formed by a silicon nitride film, for example, is formed by CVD, for example, to cover the region An, and the region Ap, the region TAn, and the region TAp. Subsequently, anisotropic etching is performed for this insulating film, so that the side wall spacer SW is formed on the side surface of each of the gate electrode G1 and the gate electrode G2 via the offset spacer OS.

Next, by photolithography and ion implantation, the n-type diffusion region (impurity region) D1 is formed in the epitaxial layer EP and the semiconductor layer SM in the region An, and the epitaxial layer EP in the region TAp, and the p-type diffusion region (impurity region) D2 is formed in the epitaxial layer EP and the semiconductor layer SM in the region Ap, and the epitaxial layer EP in the region TAn. The n-type diffusion region D1 is formed by ion implantation of phosphorous (P) or arsenic (As), for example, in the region An and the region TAp. The p-type diffusion region D2 is formed by ion implantation of boron (B) or boron difluoride ($BF_2$) in the region Ap and the region TAn.

In the region An, the n-type diffusion region D1 has a higher impurity concentration than the extension region EX1, is coupled to the extension region EX1, and forms a portion of a source region or a portion of a drain region of the MISFET 1Tr.

In the region Ap, the p-type diffusion region D2 has a higher impurity concentration than the extension region EX2, is coupled to the extension region EX2, and forms a portion of a source region or a portion of a drain region of the MISFET 2Tr.

Subsequently, heat treatment is performed for the semiconductor substrate SB at a temperature of about 1050° C. in order to activate impurities contained in the extension regions EX1 and EX2 and the diffusion regions D1 and D2.

Next, the low-resistance silicide layer SI is formed on a top surface of each of the diffusion region D1, the diffusion region D2, the gate electrode G1, and the gate electrode G2 by the salicide (Self Aligned Silicide) technique.

Specifically, the silicide layer SI can be formed in the following manner. First, a metal film for forming the silicide layer SI is formed to cover the region An, and the region Ap, the region TAn, and the region TAp. This metal film is made of cobalt, nickel, or nickel platinum alloy, for example. Then, heat treatment is performed for the semiconductor substrate SB at a temperature of about 600° C. to 700° C., thereby causing the diffusion region D1, the diffusion region D2, the gate electrode G1, and the gate electrode G2 to react with the metal film. In this manner, the silicide layer SI is formed on the top surface of each of the diffusion region D1, the diffusion region D2, the gate electrode G1, and the gate electrode G2. Thereafter, an unreacted metal film is removed.

By the above steps, the MISFET 1Tr is formed in the region An and the MISFET 2Tr is formed in the region Ap.

After the manufacturing step of FIG. 11, the interlayer insulating films IL1 and IL2, the plugs PG, and the wire M1 are formed, so that the semiconductor device illustrated in FIG. 1 is manufactured.

First, the interlayer insulating film IL1 is formed to cover the region An, and the region Ap, the region TAn, and the region TAp. As the interlayer insulating film IL1, a single layer film of a silicon oxide film, or a multilayered film of a silicon nitride film and a thick silicon oxide film formed thereon can be used, for example. After formation of the interlayer insulating film IL1, a top surface of the interlayer insulating film IL1 can be ground by CMP (Chemical Mechanical Polishing) as necessary.

Subsequently, by photolithography and dry etching, for example, contact holes are formed in the interlayer insulating film IL1, and a conductive film mainly made of tungsten (W) or the like is embedded in the contact holes. In this manner, a plurality of plugs PG are formed in the interlayer insulating film IL1. The plug PG formed in each region is coupled to the diffusion region D1 or D2 via the silicide layer SI. Although each of the gate electrodes G1 and G2 is also coupled to the plug PG, illustration is omitted in the present embodiment.

Subsequently, the interlayer insulating film IL2 is formed on the interlayer insulating film IL1 into which the plugs PG are embedded. Thereafter, after a groove for wire is formed in the interlayer insulating film IL2, a conductive film made of copper as a main component, for example, is embedded into the groove for wire, so that the wire M1 coupled to the plug PG is formed in the interlayer insulating film IL2. The structure of this wire M1 is a so-called Damascene wire structure.

Thereafter, wires in subsequent layers including the second layer are formed by Dual Damascene technique, for example. However, the description and illustration are omitted here. The wire M1 and the wires above the wire M1 are not limited to the Damascene wire structure. Those wires can be formed by patterning a conductive film, and can be tungsten wires or aluminum wires, for example.

As described above, the semiconductor device according to the present embodiment is manufactured.

<Features of Method of Manufacturing Semiconductor Device of Present Embodiment>

One of features of a method manufacturing of a semiconductor device according to the present embodiment is in that the ground plane region GP1 is formed by ion-implanting boron (B) or boron difluoride ($BF_2$) that is a p-type impurity and nitrogen (N) that is an inert dopant, and the ground plane region GP2 is formed by ion-implanting phosphorous (P), arsenic (As), or antimony (Sb) that is an n-type impurity and carbon (C) or fluorine (F) that is an inert dopant.

Figure 12:
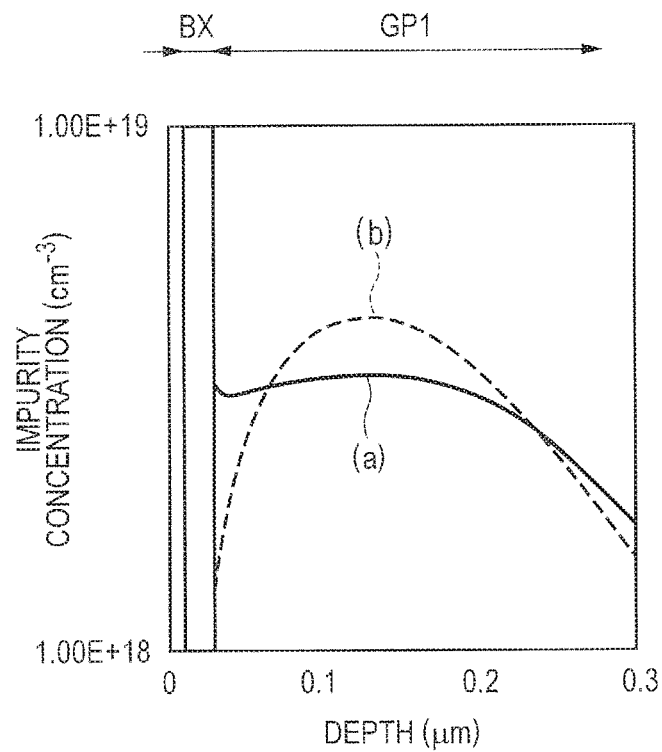
FIG. 12 illustrates an impurity concentration distribution of a ground plane region of an n-channel MISFET.
Figure 13:
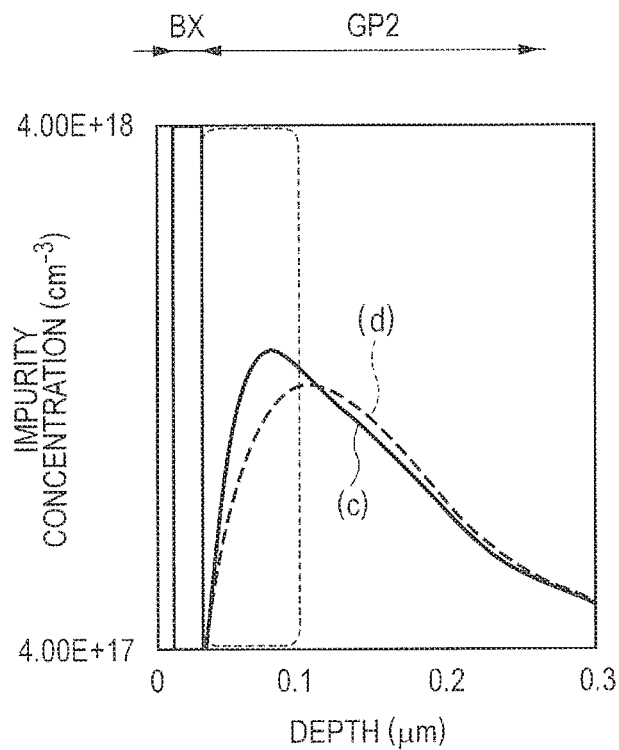
FIG. 13 illustrates an impurity concentration distribution of a ground plane region of a p-channel MISFET.

FIGS. 12 and 13 illustrate impurity concentration distributions in the ground plane regions GP1 and GP2 in a depth direction. FIGS. 12 and 13 illustrate a state after completion of heat treatment for activating impurities contained in the extension regions EX1 and EX2 and the diffusion regions D1 and D2.

In FIG. 12, (a) represents a concentration distribution in a case where boron (B) and nitrogen (N) are ion-implanted, corresponding to the present embodiment, and (b) represents a concentration distribution in a case where boron (B) is ion-implanted, corresponding to a comparative example. In (b) of the comparative example, the impurity concentration directly below the insulating layer BX is low. This is because boron (B) that has been ion-implanted segregates to the insulating layer BX in thermal oxidation when the gate insulating film GF1 is formed. Meanwhile, pile-up of boron (B) that has been ion-implanted occurs directly below the insulating layer BX. Pile-up is a phenomenon that, when interstitial defects generated in association with ion implantation of boron (B) are taken into a silicon substrate interface (an interface between the insulating layer BX and the ground plane region GP1) in later heat treatment, boron (B) follows the interstitial defects and gathers in the vicinity of the silicon substrate interface. Pile-up is a phenomenon that occurs for all ion-implanted impurities. However, in a case of boron (B), the amount of segregation is more than the amount of pile-up, and therefore the impurity concentration directly below the insulating layer BX becomes low, as illustrated in FIG. 12. When the impurity concentration directly below the insulating layer BX is reduced, an inversion layer is formed directly below the insulating layer BX during an operation of the MISFET 1Tr, so that the characteristics of the MISFET 1Tr have a time constant, as described before.

On the other hand, in (a) of the present embodiment, the impurity concentration directly below the insulating layer BX can be made higher than in the comparative example. In the present embodiment, boron (B) and nitrogen (N) that is an inert element are ion-implanted in a step of forming the ground plane region GP1, thereby promoting pile-up. That is, by ion-implanting nitrogen (N) with a high dose amount, excessive interstitial defects are introduced into a silicon substrate, pile-up in heat treatment is promoted, and the impurity concentration directly below the insulating layer BX is increased. In this manner, it is possible to prevent an inversion layer from being formed. As the inert element, carbon (C), fluorine (F), or the like is considered other than nitrogen (N). However, it is preferable to use nitrogen (N). This is because nitrogen (N) has a property that it is harder to trap excessive interstitial defects than carbon (C) or fluorine (F).

In FIG. 13, (c) represents a concentration distribution in a case where phosphorous (P) and carbon (C) are ion-implanted, corresponding to the present embodiment, and (d) represents a concentration distribution in a case where phosphorous (P) is ion-implanted, corresponding to a comparative example. In the present embodiment, phosphorous (P) and carbon (C) that is an inert element are ion-implanted in a step of forming the ground plane region GP2. Due to this, it is possible to suppress diffusion of phosphorous (P) in the depth direction by transient enhanced diffusion, so that an average impurity concentration directly below the insulating layer BX (for example, in a range of approximately 0.1 μm from the insulating layer BX) can be improved as compared with that in the comparative example. Therefore, it is possible to prevent an inversion layer from being formed directly below the insulating layer BX. Further, as the inert element, it is more preferable to use carbon (C) or fluorine (F) than nitrogen (N). This is because carbon (C) or fluorine (F) can react with interstitial defects with a lower dose amount than nitrogen (N) to form clusters and trap phosphorous (P). Therefore, it is possible to prevent transient enhanced diffusion of phosphorous (P) caused by introduction of excessive interstitial defects generated in a case where an inert element is ion-implanted with a high dose amount.

Figure 14:
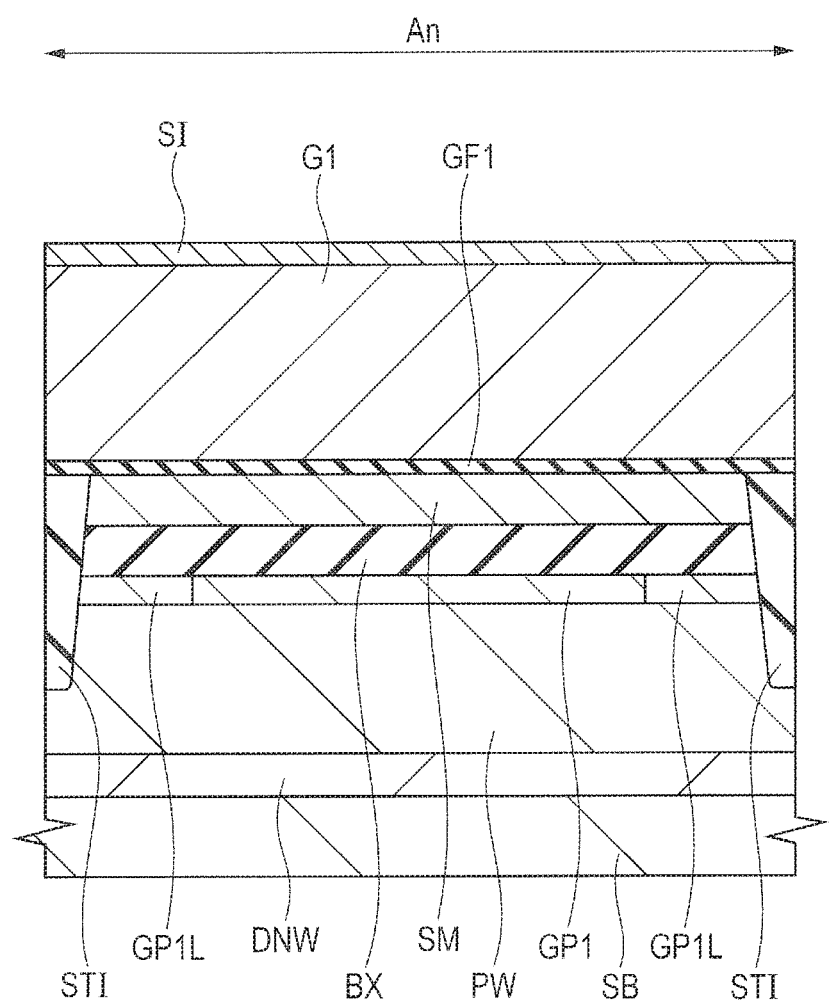
FIG. 14 is a cross-sectional view of a MISFET of a comparative example, taken along a gate-width direction.
Figure 15:
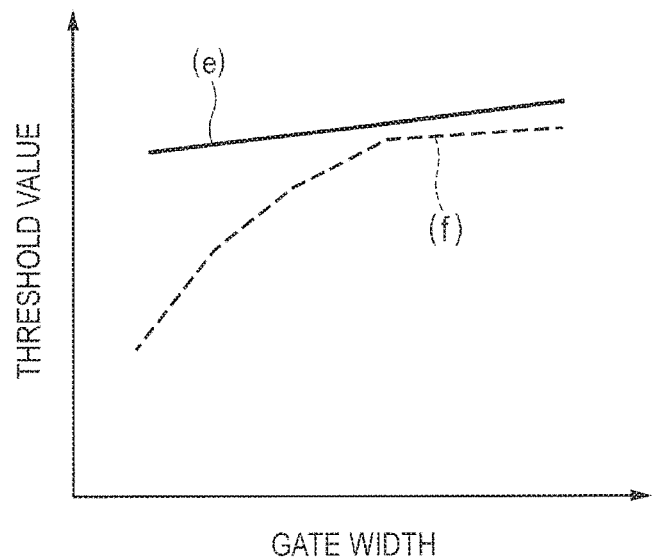
FIG. 15 illustrates a relation between a gate width and a threshold value of a MISFET.

Further, according to the present embodiment, it is possible to reduce a phenomenon that a threshold value is lowered with reduction of a channel width (a so-called "narrow channel effect") in the n-channel MISFET 1Tr. FIG. 14 is a cross-sectional view of a MISFET of a comparative example, taken along a gate-width direction, and FIG. 15 illustrates a relation between a gate width and a threshold value of a MISFET. In FIG. 15, (e) represents the characteristics of the MISFET 1Tr of the present embodiment, and (f) represents the characteristics of the MISFET of the comparative example of FIG. 14.

As described before, boron (B) that has been ion-implanted in order to form a ground plane region segregates to the insulating layer BX by being subjected to heat treatment, and therefore the impurity concentration is reduced. Further, as illustrated in FIG. 14, the impurity concentration at both ends (labeled with GP1L) of the ground plane region is further reduced as compared with that in a central portion (labeled with GP1). This is because segregation of boron (B) occurs not only in the insulating layer BX but also in the isolation portion STI at both ends of the ground plane region. Therefore, in the MISFET of the comparative example, a threshold value at both ends in the gate-width direction is lowered as compared with that in the central portion, so that the threshold value of the MISFET is lowered as illustrated in (f) in FIG. 15.

On the other hand, according to the present embodiment, ion-implantation of boron (B) and nitrogen (N) that is an inert element can promote pile-up and can also improve the impurity concentration at both ends in the gate-width direction, as described above. Therefore, it is possible to reduce the above-described narrow channel effect, so that the characteristics illustrated in (e) in FIG. 15 can be obtained. That is, it is possible to prevent the threshold value of the MISFET 1Tr from being lowered.

<Modification>

Figure 17:
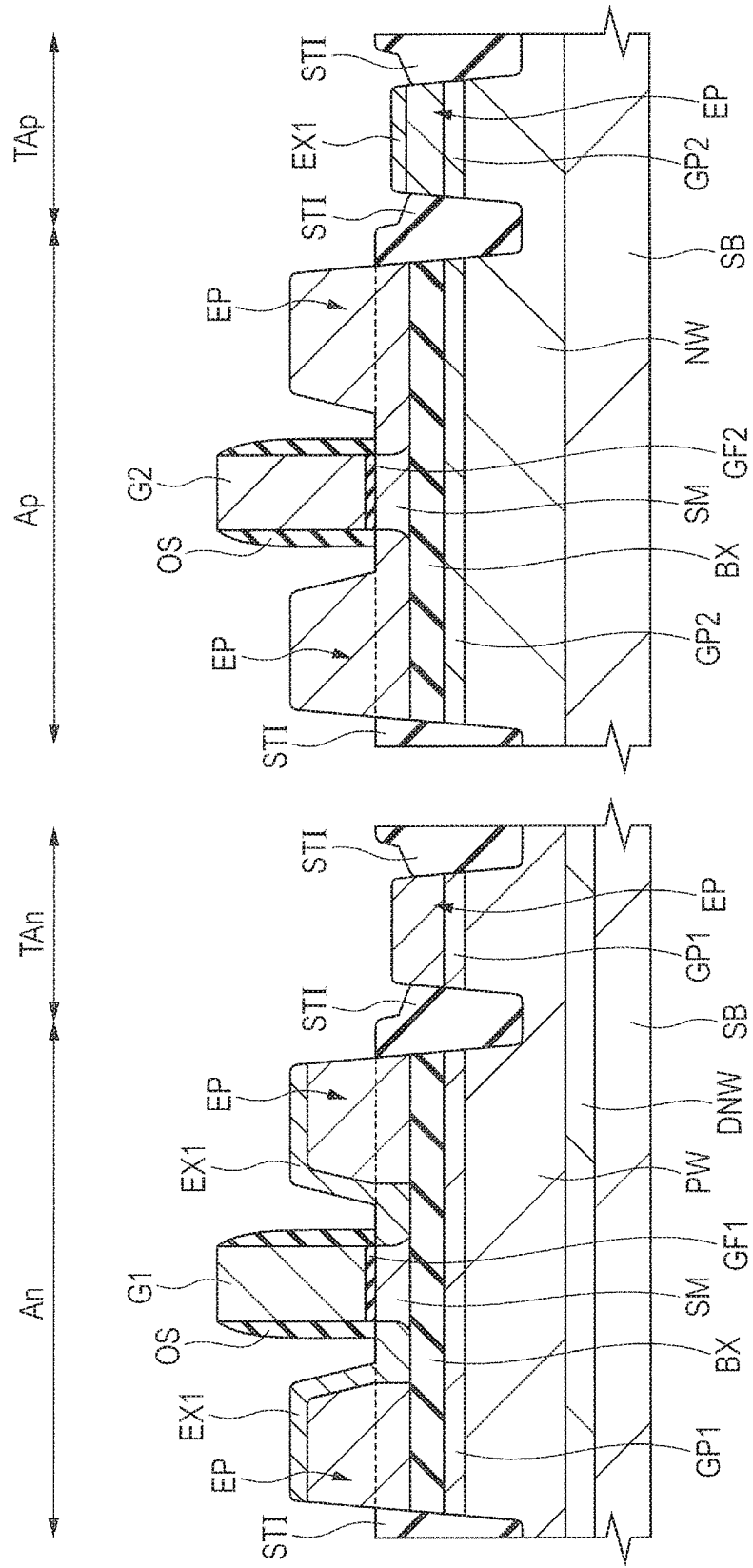
FIG. 17 is a cross-sectional view illustrating a manufacturing step of a semiconductor device according to a modification.
Figure 18:
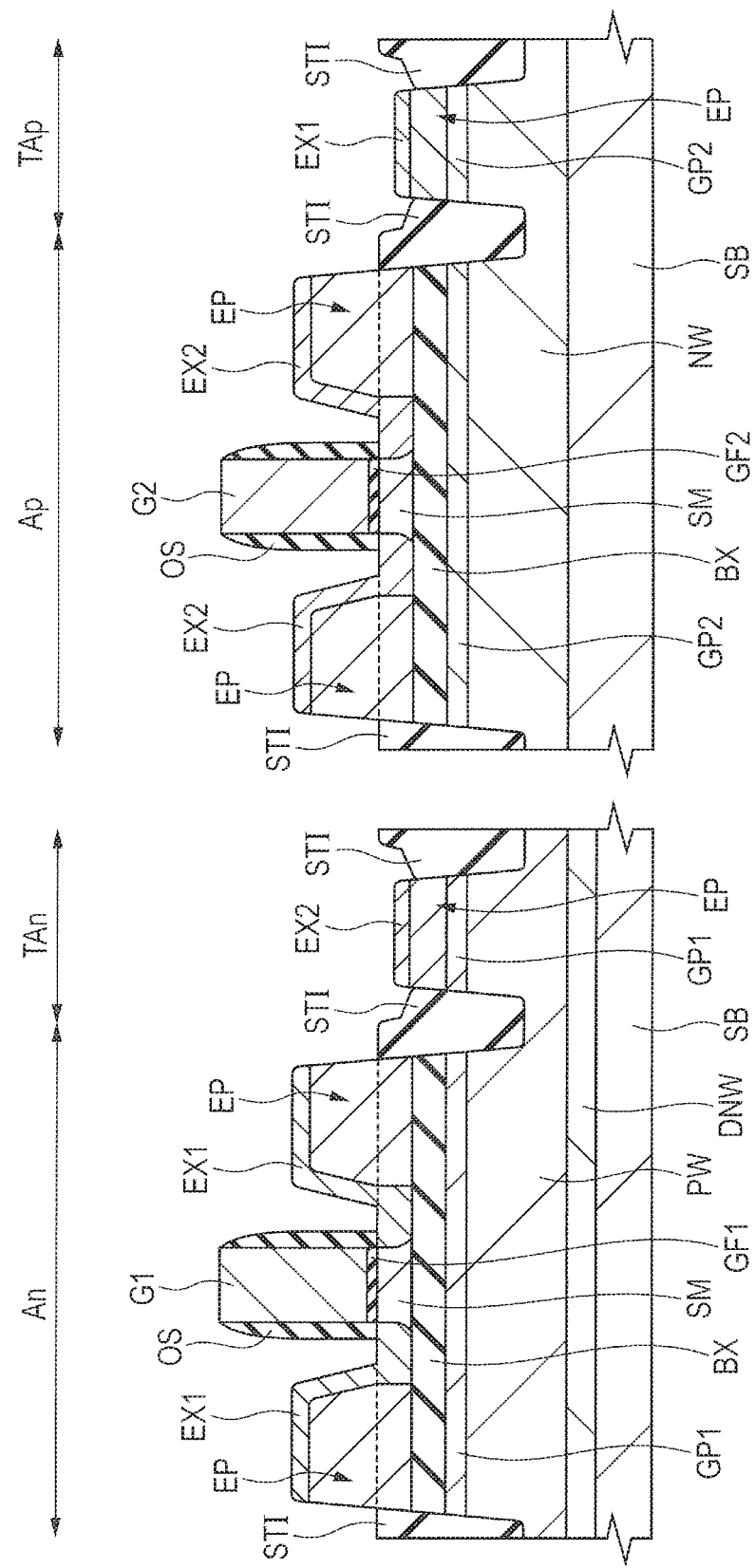
FIG. 18 is a cross-sectional view illustrating a manufacturing step of the semiconductor device subsequent to FIG. 17.

FIGS. 17 and 18 are cross-sectional views illustrating manufacturing steps of a semiconductor device according to a modification. The modification is different from the above embodiment in processes of forming the ground plane regions GP1 and GP2. In the above embodiment, the p-well region PW, the ground plane region GP1, the n-well region NW, and the ground plane region GP2 are formed in that order. In this modification, the step of forming the ground plane region GP1 is performed after formation of the extension region EX1, and the step of forming the ground plane region GP2 is performed after formation of the extension region EX2. As for formation of the ground plane regions GP1 and GP2, the modification is the same as the above embodiment. However, energy of ion-implantation is set to be higher than in the above embodiment, in order to cause ions to pass through the gate electrodes G1 and G2, the epitaxial layer EP, and the like. Although an example in which the ground plane region GP2 is formed after the ground plane region GP1 is formed is described, the order of formation can be reversed.

In the above, the invention made by the inventors of the present application has been specifically described by way of the embodiments. However, it is naturally understood that the present invention is not limited to the aforementioned embodiments, and can be changed in various ways within the scope not departing from the gist thereof.

What is claimed is:

1. A method of manufacturing a semiconductor device, comprising the steps of:
   (a) providing an SOI substrate having:
      a semiconductor substrate that includes a first region in which an n-type first MISFET is to be formed and a second region in which a p-type second MISFET is to be formed;
      an insulating layer formed on the semiconductor substrate; and
      a semiconductor layer formed on the insulating layer;
   (b) forming a first semiconductor region by ion-implanting a p-type impurity and nitrogen into the semiconductor substrate in the first region;
   (c) forming a second semiconductor region by ion-implanting an n-type impurity and one of carbon and fluorine into the semiconductor substrate in the second region;
   (d) forming the first MISFET in the first region; and
   (e) forming the second MISFET in the second region.

2. The method according to claim 1, wherein each of the first semiconductor region and the second semiconductor region is in contact with the insulating layer.

3. The method according to claim 1, wherein an impurity concentration of the semiconductor layer is $1\times10^{13}$ cm$^{-3}$ or less.

4. The method according to claim 1, wherein a thickness of the semiconductor layer is 10 to 20 nm.

5. The method according to claim 1, wherein a thickness of the insulating layer is 10 to 20 nm.

6. The method according to claim 1,
wherein the step (d) includes:
 (d-1) forming a first gate electrode on the semiconductor layer via a first gate insulating film, the first gate electrode comprising a first side and a second side opposite the first side; and
 (d-2) forming an n-type third semiconductor region in the semiconductor layer at both the first side and the second side of the first gate electrode, and wherein the step (e) includes:
 (e-1) forming a second gate electrode on the semiconductor layer via a second gate insulating film, the second gate electrode comprising a first side and a second side opposite the first side; and
 (e-2) forming a p-type fourth semiconductor region in the semiconductor layer at both the first side and the second side of the second gate electrode.

7. The method according to claim 1, wherein the first semiconductor region is formed by ion-implanting the p-type impurity and nitrogen into the semiconductor substrate in the first region, without ion-implanting carbon into the semiconductor substrate in the first region, and
wherein the second semiconductor region is formed by ion-implanting the n-type impurity and the one of carbon and fluorine into the semiconductor substrate in the second region without ion-implanting nitrogen into the semiconductor substrate in the second region.

* * * * *